(12) United States Patent
Lindstedt et al.

(10) Patent No.: US 11,895,782 B2
(45) Date of Patent: Feb. 6, 2024

(54) VEHICLE DISPLAY CARRIER WITH HEAT SINK

(71) Applicant: Stoneridge Electronics AB, Solna (SE)

(72) Inventors: Jan Lindstedt, Birmingham, MI (US); Jon Möller, Sollentuna (SE); Håkan Hedenberg, Järfälla (SE); Mattias Sjögren, Järfälla (SE); Daniel Thomas, Vallentuna (SE)

(73) Assignee: STONERIDGE ELECTRONICS AB, Solna (SE)

( * ) Notice: Subject to any disclaimer, the term of this patent is extended or adjusted under 35 U.S.C. 154(b) by 261 days.

(21) Appl. No.: 17/312,143

(22) PCT Filed: Dec. 18, 2018

(86) PCT No.: PCT/EP2018/085698
§ 371 (c)(1),
(2) Date: Jun. 9, 2021

(87) PCT Pub. No.: WO2020/125961
PCT Pub. Date: Jun. 25, 2020

(65) Prior Publication Data
US 2022/0046809 A1    Feb. 10, 2022

(51) Int. Cl.
*B60K 35/00* (2006.01)
*H05K 5/00* (2006.01)
*H05K 7/20* (2006.01)

(52) U.S. Cl.
CPC ......... *H05K 5/0017* (2013.01); *B60K 35/00* (2013.01); *H05K 5/0026* (2013.01); *H05K 7/20854* (2013.01); *B60K 2370/152* (2019.05); *B60K 2370/42* (2019.05); *B60K 2370/691* (2019.05)

(58) Field of Classification Search
None
See application file for complete search history.

(56) References Cited

U.S. PATENT DOCUMENTS

| | | | |
|---|---|---|---|
| 6,532,152 B1 * | 3/2003 | White | G02F 1/133308 312/223.1 |
| 7,164,586 B2 * | 1/2007 | Lin | H05K 7/20972 348/794 |
| 8,526,173 B2 | 9/2013 | Yokota et al. | |

(Continued)

FOREIGN PATENT DOCUMENTS

| | | |
|---|---|---|
| CN | 108773269 A | 11/2018 |
| DE | 102011083022 A1 | 3/2013 |

(Continued)

OTHER PUBLICATIONS

International Preliminary Report on Patentability for International Application No. PCT/EP2018/085698 dated Jul. 1, 2021.

(Continued)

*Primary Examiner* — Xanthia C Relford
(74) *Attorney, Agent, or Firm* — Carlson, Gaskey & Olds, P.C.

(57) ABSTRACT

A vehicle display assembly includes a display configured to graphically depict information. A printed circuit board (PCB) is in communication with the display. A carrier is clamped between the display and PCB to form an instrument cluster assembly. The carrier includes cooling fins.

14 Claims, 6 Drawing Sheets

(56) References Cited

U.S. PATENT DOCUMENTS

| | | | |
|---|---|---|---|
| 2011/0188192 A1 | 8/2011 | Yokota et al. | |
| 2014/0321054 A1 | 10/2014 | Kaefer et al. | |
| 2016/0368379 A1* | 12/2016 | Larry | B60K 35/00 |
| 2017/0018253 A1* | 1/2017 | Castaneda | G06F 13/4282 |
| 2017/0120824 A1* | 5/2017 | Hallack | H05K 5/0017 |
| 2018/0065483 A1* | 3/2018 | Liburdi | G02F 1/137 |
| 2018/0218654 A1 | 8/2018 | Hashimoto et al. | |

FOREIGN PATENT DOCUMENTS

| | | | |
|---|---|---|---|
| JP | 2016179715 A | 10/2016 | |
| WO | 03024733 A1 | 3/2003 | |

OTHER PUBLICATIONS

International Search Report and Written Opinion for International Application No. PCT/EP2018/085698 dated Aug. 29, 2019.

* cited by examiner

VEHICLE DISPLAY CARRIER WITH HEAT SINK

BACKGROUND

This disclosure relates to a vehicle display assembly, and, more particularly, an arrangement of a display, carrier and printed circuit board (PCB), such as those used in an instrument cluster and an infotainment display.

Vehicle displays, such as instrument clusters, are widely used in passenger and commercial vehicles to convey vehicle information to the driver. Typical modern instrument clusters use a display such as an LCD or other common type of display. The display is arranged in a housing, which may also contain a PCB. The electronic components generate heat, particularly from chips on the PCB. The PCB is arranged immediately adjacent to the display. The heat-generating chips on the PCB are arranged to face away from and on an opposite side relative to the display to better reject heat to the environment within the housing.

SUMMARY

In one exemplary embodiment, a vehicle display assembly includes a display configured to graphically depict information. A printed circuit board (PCB) may be in communication with the display. A carrier may be clamped between the display and PCB to form an instrument cluster assembly. The carrier may include cooling fins.

In a further embodiment of the above, the PCB may include at least one chip. The carrier may include an aperture. The at least one chip may be at least partially disposed within and extending into the aperture.

In a further embodiment of any of the above, the at least one chip may include at least one of a processor and/or a memory chip.

In a further embodiment of any of the above, the carrier may include a wall surrounding the aperture. The wall may be raised relative to an immediate adjacent region of the carrier. The at least one chip may be at least partially disposed within and in overlapping relationship with the wall.

In a further embodiment of any of the above, the PCB may include openings. The carrier may include standoffs integrally formed therewith. The standoffs may extend through the openings.

In a further embodiment of any of the above, the PCB may be a first PCB and may include a second PCB. The second PCB may be secured to the standoffs. A connector may electrically connect the first and second PCBs.

In a further embodiment of any of the above, the display may include mounting features. The carrier may include a first set of holes. The PCB may include a second set of holes. The PCB may include fasteners that extend through the first and second set of holes. The fasteners may be secured to the mounting features. The fasteners may clamp the carrier between the display and the PCB.

In a further embodiment of any of the above, the mounting features may be protrusions. The carrier may have a first side facing the display that includes pockets receiving the protrusions. The carrier may include a second side opposite the first side that faces the PCB. The PCB may abut the second side. The fasteners may be screws. The screws may be threaded into the mounting features.

In a further embodiment of any of the above, the carrier may have a first thickness at the pockets. The cooling fins may have a second thickness. The second thickness may be less than the first thickness.

In a further embodiment of any of the above, the carrier may have a carrier perimeter. The carrier perimeter may include a pair of long edges and a pair of short edges. The cooling fins may be arranged on one of the long edges.

In a further embodiment of any of the above, the cooling fins may extend outward from a side of the carrier that is opposite the display. The PCB may be arranged inboard of and adjacent to the cooling fins.

In a further embodiment of any of the above, the display may have a display perimeter. The carrier may include mounting tabs that extend outwardly beyond the display perimeter. The mounting tabs may be configured to be secured to an instrument cluster housing.

In a further embodiment of any of the above, the vehicle display assembly may include a housing. The housing may include a clear front lens. The housing may include a back cover. The housing may enclose the display, PCB and carrier. The housing may include a clear front lens and a back cover that enclose the display, PCB and carrier, with the display facing the front lens. The mounting tabs may be secured to the housing.

In a further embodiment of any of the above, the display may have a display perimeter. The carrier may have a portion that extends beyond the display perimeter. The portion may include windows that provide light tubes. The PCB may include light emitting diodes (LEDs). The light emitting diodes may be aligned with and arranged at least partially within the windows.

In a further embodiment of any of the above, the number of cooling fins may be at least eight.

In a further embodiment of any of the above, the cooling fins may extend along the one of the long edges at least 75% of its width.

In a further embodiment of any of the above, the carrier may have an average cross-sectional thickness in a range of 2-5 mm.

In a further embodiment of any of the above, the PCB may include a processor that faces the display and engages the carrier.

In a further embodiment of any of the above, the carrier may be a metallic structure that is at least one of cast and/or machined. The carrier may be at least one of magnesium and/or aluminum.

In a further embodiment of any of the above, the vehicle display assembly may include an instrument cluster. The display may be configured to graphically depict information corresponding to a first data. The PCB may have a processor configured to receive a second data and provide the first data to the display. The second data may correspond to vehicle information from a communications bus. The first data may correspond to one or more vehicle parameters.

In another exemplary embodiment, a vehicle display assembly may include a display configured to graphically depict information. A printed circuit board (PCB) may be in communication with the display. The PCB may have at least one of a processor and a memory chip. A carrier may be clamped between the display and PCB to form an instrument cluster assembly. The display may be secured to the carrier at multiple fastening points. The carrier may be a metallic structure. The carrier may have a thickness in a range of 2-5 mm at the fastening points. The at least one of the processor and the memory chip may engage the carrier and face the display.

These and other features of the present disclosure can be best understood from the following specification and drawings, the following of which is a brief description.

BRIEF DESCRIPTION OF THE DRAWINGS

The disclosure can be further understood by reference to the following detailed description when considered in connection with the accompanying drawings wherein.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

Figure 1:
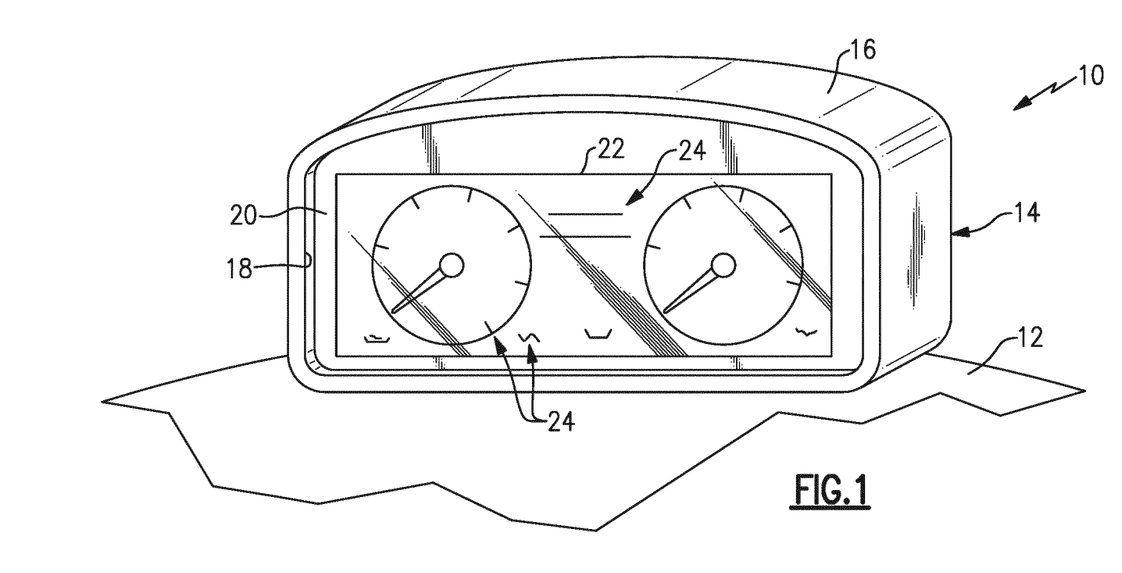
FIG. 1 is a schematic view of an example vehicle instrument cluster.

A vehicle 10 includes an interior 12 that typically has an instrument cluster 14. The instrument cluster 14 may be arranged in a variety of configurations based upon various aesthetic and packaging considerations. Although the disclosed vehicle display assembly is described in more detail in connection with the instrument cluster 14, it should be understood that the vehicle display assembly may be used in other vehicle applications, such as an infotainment system.

The instrument cluster 14 includes the housing 16 having an opening 18 that is covered by a lens 20. A display 22 is arranged within the housing 16 beneath the lens 20. The display, which may be an LCD, LED, or other type of display, conveys information 24 to the driver through the use of various graphics and text messages relating to various vehicle operating parameters.

Figure 2A:
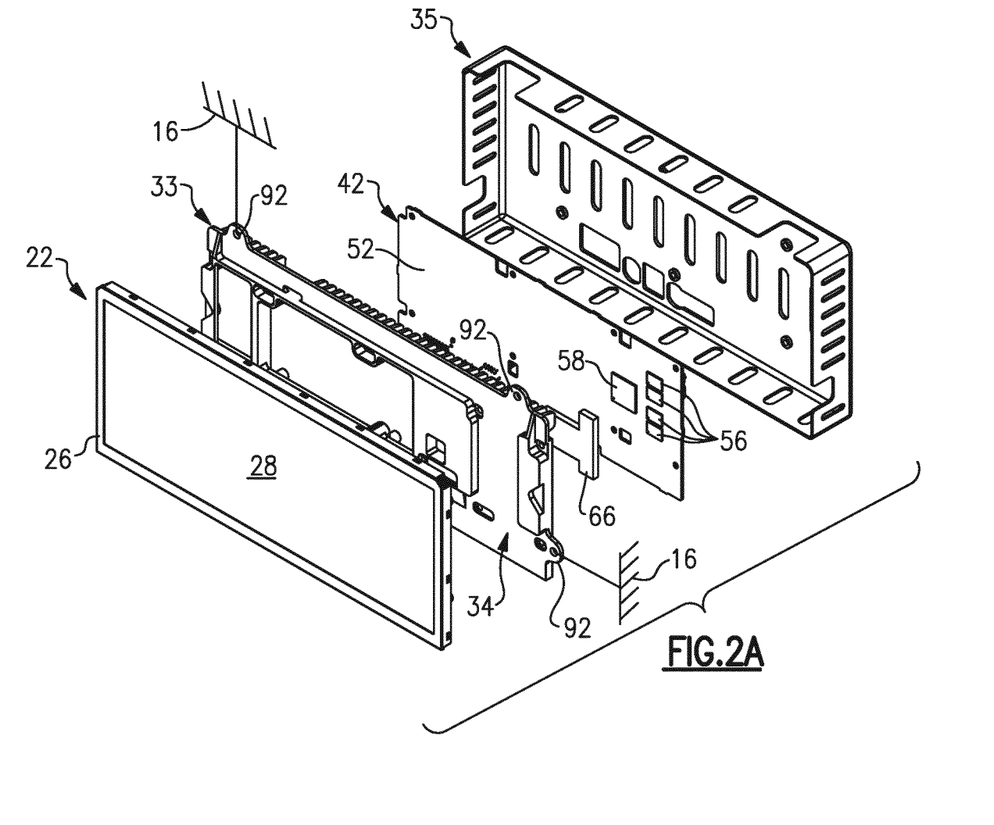
FIG. 2A is an exploded view of a vehicle display for use as an instrument cluster assembly, illustrating first sides of a carrier and a printed circuit board (PCB).
Figure 2B:
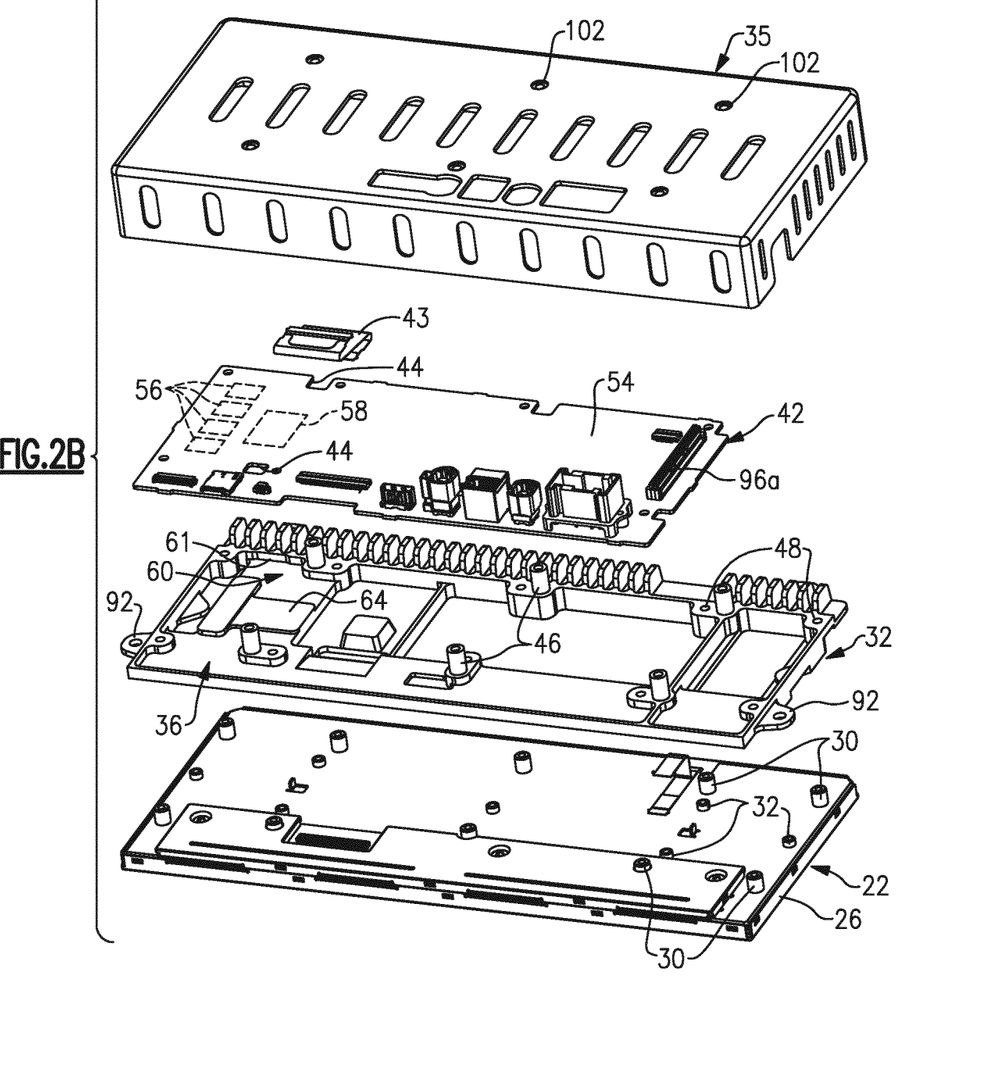
FIG. 2B is an exploded view of the vehicle display illustrating second sides of the carrier and the PCB.

An instrument cluster assembly is shown in FIGS. 2A and 2B. A display 22 includes a frame 26 that supports a screen 28. The display 22 is mounted to a carrier 33 that provides structural support to the display 22 within and on the housing 16. A PCB 42 that is in communication with the display 22 is also mounted to the carrier 33. The display 22 is configured to graphically depict information corresponding to a first data from the PCB 42 based upon a second data from a communications bus (e.g., CAN, FlexRay, automotive Ethernet, etc.), and the first data corresponds to one or more vehicle parameters, such as speed, camera feeds or images, and RPMs. A cover 35 is arranged over the PCB 42 and the carrier 33 in a snap-fit relationship with a perimeter of the frame 26, for example.

The carrier 33 includes a first side 34 that supports the display 22 and a second side 36 that supports a first side 52 of the PCB. A second side 54 of the PCB 42 faces away from the display 22. The PCB 42 and the display 22 are arranged in intimate contact with the carrier 33, which is metallic and may dissipate heat.

Figures 4A, 4B:
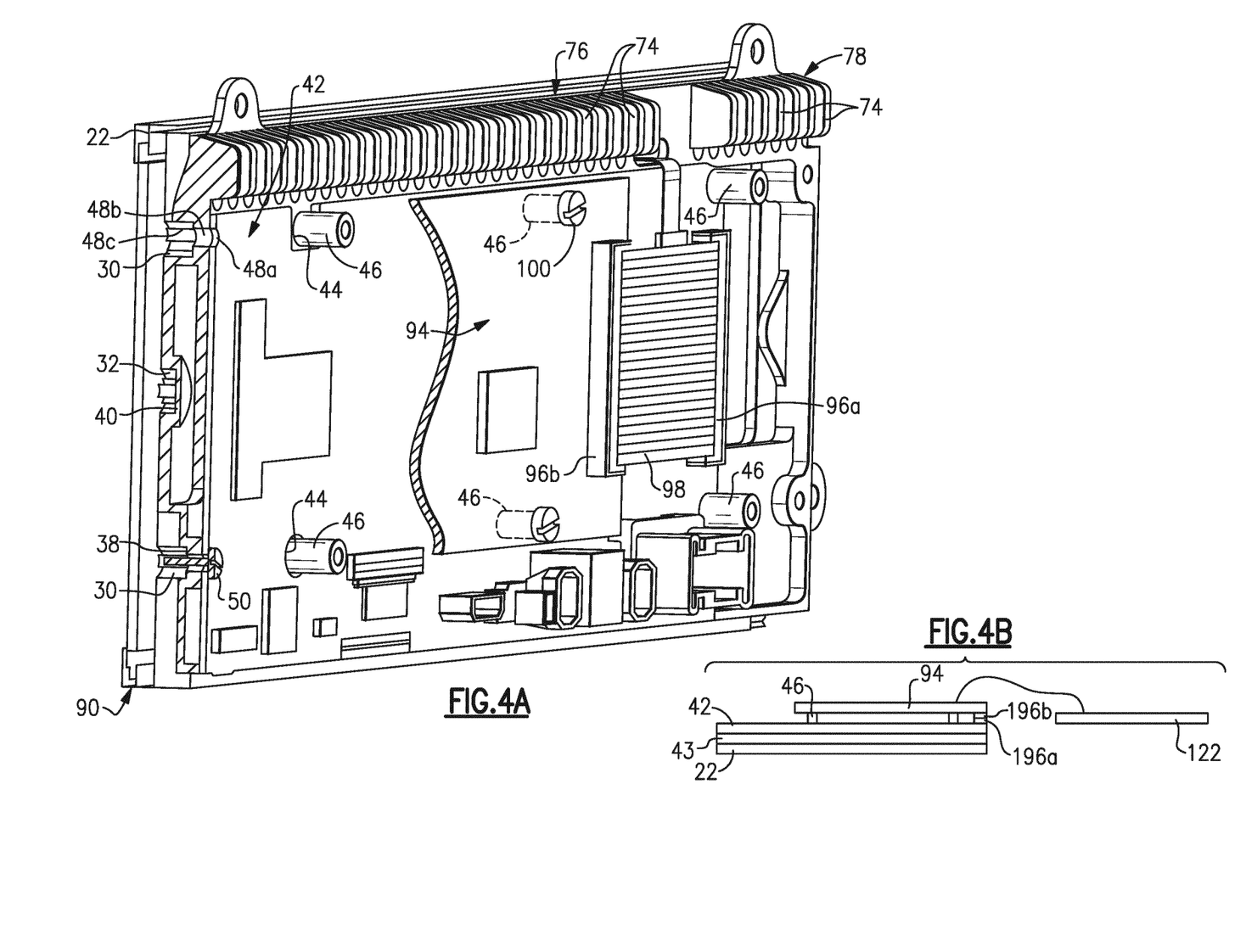
FIG. 4A is a cross-sectional perspective view of a display, the carrier, and the PCB shown in FIGS. 2A and 2B in an assembled condition.
FIG. 4B is a schematic view of the assembly shown in FIG. 4A connected to a secondary display.

In the example arrangement, a backside of the frame 26 includes first and second mounting features 30, 32, which correspond to protrusions in the example, that respectively receive with first and second recesses 38, 40 of the carrier 33 when arranged in an assembled condition, as shown in FIG. 4A. Holes 48a, 48b may be provided respectively in the PCB 42 and the carrier 33 in an area of the first recesses 38. The first mounting features 30 has a threaded hole 48c that receives a fasteners 50, which secures the carrier 33 and PCB 42 in a clamping relationship with the frame 26. In this manner, the display 22, carrier 33, and PCB 42 are provided in a rigid, structurally robust stack. One or more insulation pads or spacers may be provided between the display 22 and carrier 33, if desired.

A ribbon 43 is used to electrically connect the display 22 to the PCB 42 and its various chips, which may include memory chips 56 and one or more processors 58. These chips generate a significant amount of heat that must be dissipated. The hot side of the highest heat generating chips (e.g., the processor 58 and memory chips 56) are "sandwiched" between the display 22 and the carrier 33, trapping heat within the assembly.

Figure 5:
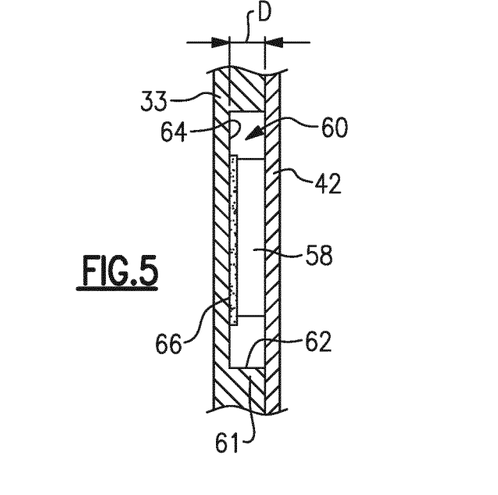
FIG. 5 is a partial, cross-sectional view of the carrier and the PCB.

The carrier 33 includes one or more pockets 60 that provide electromagnetic field (EMF) shielding for any chips disposed within the pocket 60. The pocket 60 is provided by a wall 61 extending a depth D (FIG. 5) and providing a perimeter 62 about the chip, such that the chip and wall 61 are in overlapping relationship with one another. In one example, the depth D is in a range of 5-15 mm. The pocket 60 may include a surface 64 on which a thermally conductive material 66, such as a paste, is arranged. The thermally conductive material 66 is in engagement with both the surface 64 and the chip, for example, memory 56 and processor 58 chips, as shown in FIG. 5. This arrangement transfers heat to the carrier 33 and toward the display 22—a region where heat is typically undesirable.

Figure 3A:
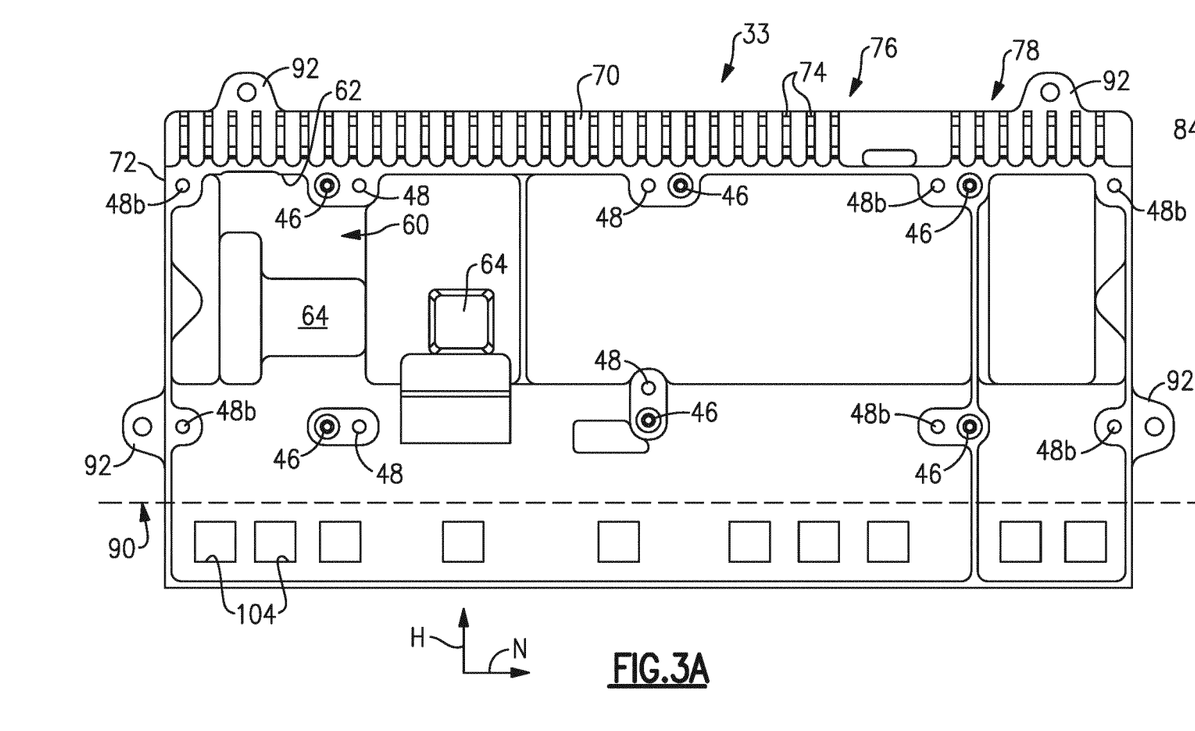
FIG. 3A depicts the second side of another carrier embodiment.
Figure 3B:
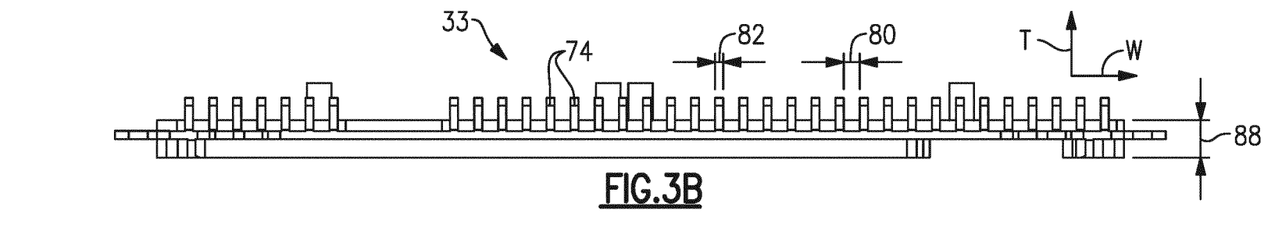
FIG. 3B is one end view of a long edge of the carrier shown in FIG. 3A.
Figure 3C:
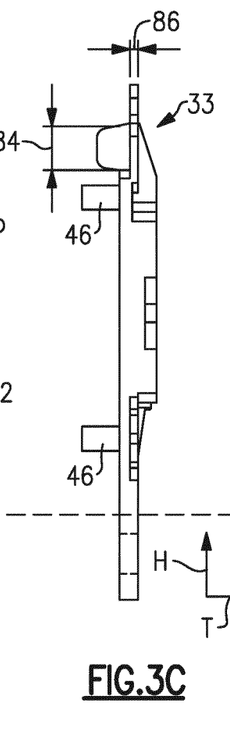
FIG. 3C is another end view of a short edge of the carrier shown in FIG. 3A.

Referring to FIGS. 3A-3C, the carrier 33 includes a carrier perimeter 68 extending in a width W and a height H that respectively provide long and short edges 70, 72. The carrier 33 also provides a thickness T sufficient to provide a structural support and resist twisting of the assembly during handling an assembly of the instrument cluster. In one example, the thickness T is in a range of 2-5 mm. Carrier 33 may be constructed from heat conductive metallic materials, such as aluminum or magnesium, which may be cast or machined from billet stock. The carrier 33 has a carrier thickness 88 in a range of 2-5 mm, for example, in the area near the fastening points for the display 22 (e.g., around holes 48b).

In the example, cooling fins 74 are provided on one of the long edges 70, which corresponds to a top of the display 22 in the example, and integrally formed with the carrier 33. The cooling fins 74 extend outward from the second side 36 of the carrier 33, which is opposite the display 22, and the PCB 42 is arranged inboard of and adjacent to the cooling fins 74.

The cooling fins 74 may be grouped into a first and second cluster 76, 78 in one example embodiment. The first and second clusters 76, 78 together extend along the long edge 70 at least 75% of its width. The cooling fins 74, which number at least eight in one example, are arranged in a spacing 80 from one another and have a thickness 82, a width 84, and a height 86. In one example, the spacing 80 is approximately 5 mm, the thickness 82 is approximately 2 mm, the width 84 is approximately 13 mm, and the height 86 is approximately 17 mm. In the example embodiment, "approximately" or "about" means+/−25%. The carrier 33 has a first thickness (i.e., thickness 88) at the pocket 60, and the cooling fins 74 have a second thickness (i.e., thickness 82) that is less than the first thickness.

In the example, the display 22 includes a display perimeter 90 arranged within the carrier perimeter 68. In the example illustrated in FIGS. 3A-3C, mounting tabs 92 extend beyond the display perimeter 90 and are used to mount the instrument cluster assembly within and to the housing 16.

As shown in FIG. 2B, the carrier 33 includes multiple integrally formed standoffs 46. Referring to FIG. 4A, the standoffs 46 extend through openings 44 in the PCB 42 and may be used to support an optional expander board 94. The expander board 94 may provide functionality specific to a particular OEM, and the PCB 42 may provide the functionality that is common across multiple OEMs. The expander board 94 is connected to the PCB 42 via a connector 98 connected to first and second expansion slots 96A, 96B. A ribbon connector is shown in FIG. 4A. Alternatively a rigid, interlocking connector configuration may be used as illustrated in FIG. 4B, which also acts to support the ends of the PCBs relative to one another. Fasteners 100 secure the expander board 94 to the standoffs 46. Holes 102 (FIG. 2B) may be provided in the cover 35, and the fasteners 100 shown in FIG. 4A may be used to secure the cover 35 to the standoffs 46.

Figure 7A:
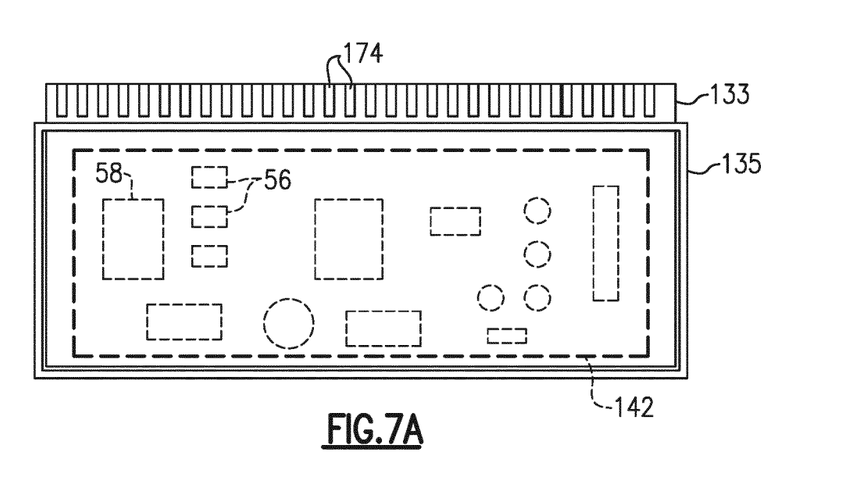
FIGS. 7A and 7B schematically illustrate alternative vehicle display assemblies illustrating the carrier and a cover.
Figure 7B:
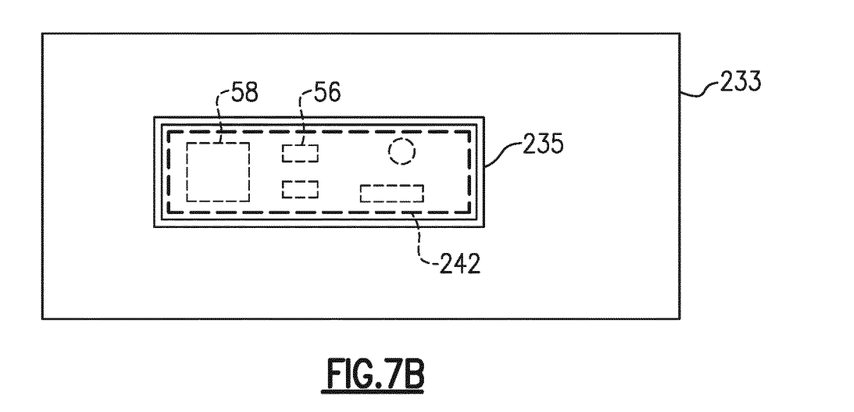

In the arrangement shown in FIGS. 2A and 2B, the cover 35 encloses the carrier 33 and PCB 42. The cooling fins 74 are also arranged within the cover 35. Referring to FIG. 7A, depending upon display size and packaging considerations, the cooling fins 174 on the carrier 133 may be disposed outside of the cover 135 for improved cooling. The cover 135 protects the electronics on the PCB 142 from dust and moisture. For smaller PCBs 242 and/or larger displays, as shown in FIG. 7B, the cover 235 is the approximate size of the PCB 242 and much smaller than the carrier 233. For such configurations, cooling fins may not be necessary, as the exposed portion of the thick, metallic carrier 233 provides a sufficient heat sink.

Figure 6:
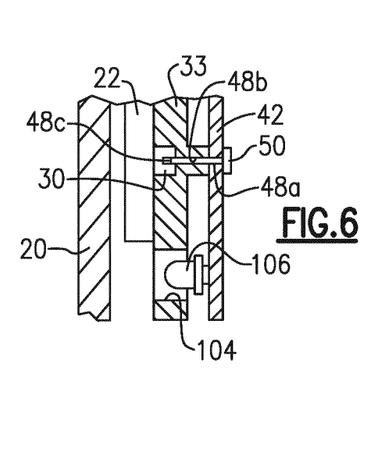
FIG. 6 is a partial, cross-sectional view of a portion of the instrument cluster.

Returning to FIGS. 3A, 3C, and 6, the carrier 33 may include windows 104 that act as light tubes. A light 106, such as an LED, may be at least partially disposed in each window 104. The lights 106 may be selectively activated to illuminate a symbol provided on the lens 20, which may be used to communicate a message or warning to the driver.

It should also be understood that although a particular component arrangement is disclosed in the illustrated embodiment, other arrangements will benefit herefrom. Although particular step sequences are shown, described, and claimed, it should be understood that steps may be performed in any order, separated or combined unless otherwise indicated and will still benefit from the present invention.

Although the different examples have specific components shown in the illustrations, embodiments of this invention are not limited to those particular combinations. It is possible to use some of the components or features from one of the examples in combination with features or components from another one of the examples.

Although an example embodiment has been disclosed, a worker of ordinary skill in this art would recognize that certain modifications would come within the scope of the claims. For that reason, the following claims should be studied to determine their true scope and content.

What is claimed is:

1. A vehicle display assembly comprising:
a display configured to graphically depict information;
a printed circuit board (PCB) in communication with the display, the PCB having at least one of a processor and a memory chip; and
a carrier clamped between the display and PCB to form an instrument cluster assembly the display secured to the carrier at multiple fastening points, the carrier is a metallic structure, and the at least one of the processor and the memory chip engages the carrier and faces the display, wherein the carrier has an average cross-sectional thickness in a range of 2-5 mm.

2. The vehicle display assembly of claim 1, wherein the carrier includes a pocket, the at least one of the processor and the memory chip is at least partially disposed within and extending into the pocket.

3. The vehicle display assembly of claim 2, wherein the carrier includes a wall surrounding the aperture that is raised relative to an immediate adjacent region of the carrier, the at least one chip at least partially disposed within and in overlapping relationship with the wall.

4. The vehicle display assembly of claim 1, wherein the PCB includes openings, and the carrier includes standoffs integrally formed therewith and extending through the openings, wherein the PCB is a first PCB, and comprising a second PCB secured to the standoffs, a connector electrically connecting the first and second PCBs.

5. The vehicle display assembly of claim 1, wherein the display includes mounting features, the carrier includes a first set of holes, and the PCB includes a second set of holes, and comprising fasteners that extend through the first and second set of holes and are secured to the mounting features to clamp the carrier between the display and the PCB.

6. The vehicle display assembly of claim 1, wherein the carrier includes cooling fins, and the number of cooling fins is at least eight.

7. The vehicle display assembly of claim 6, wherein the carrier has a carrier perimeter that includes a pair of long edges and a pair of short edges, wherein the cooling fins extend along the one of the long edges at least 75% of its width.

8. The vehicle display assembly of claim 7, wherein the cooling fins extend outward from a side of the carrier that is opposite the display, and the PCB is arranged inboard of and adjacent to the cooling fins.

9. The vehicle display assembly of claim 7, wherein the display has a display perimeter, and the carrier includes mounting tabs that extend outwardly beyond the display perimeter, the mounting tabs are configured to be secured to an instrument cluster housing.

10. The vehicle display assembly of claim 9, comprising a housing including a clear front lens and a back cover that enclose the display, PCB and carrier, with the display facing the front lens, the mounting tabs secured to the housing.

11. The vehicle display assembly of claim 7, wherein the display has a display perimeter, and the carrier has a portion that extends beyond the display perimeter, the portion includes windows that provide light tubes, and the PCB includes light emitting diodes (LEDs) that are aligned with and arranged at least partially within the windows.

12. The vehicle display assembly of claim 1, wherein the carrier is at least one of cast and/or machined and is at least one of magnesium and/or aluminum.

13. A vehicle display assembly comprising:
a display configured to graphically depict information;
a printed circuit board (PCB) in communication with the display, the PCB having at least one of a processor and a memory chip; and
a carrier clamped between the display and PCB to form an instrument cluster assembly the display secured to the carrier at multiple fastening points, the carrier is a metallic structure, and the at least one of the processor and the memory chip engages the carrier and faces the display;
wherein the display includes mounting features, the carrier includes a first set of holes, and the PCB includes a second set of holes, and comprising fasteners that extend through the first and second set of holes and are secured to the mounting features to clamp the carrier between the display and the PCB, wherein the mounting features are protrusions, the carrier has a first side facing the display that includes recesses receiving the protrusions, and the carrier includes a second side opposite the first side that faces the PCB, the PCB abutting the second side, and the fasteners are screws that are threaded into the mounting features.

14. A vehicle display assembly comprising:
a display configured to graphically depict information;
a printed circuit board (PCB) in communication with the display, the PCB having at least one of a processor and a memory chip;
a carrier clamped between the display and PCB to form an instrument cluster assembly the display secured to the carrier at multiple fastening points, the carrier is a metallic structure, and the at least one of the processor and the memory chip engages the carrier and faces the display; and
an instrument cluster, wherein display is configured to graphically depict information corresponding to a first data, the PCB has a processor configured to receive a second data and provide the first data to the display, the second data corresponds to vehicle information from a communications bus, and the first data corresponds to one or more vehicle parameters.

* * * * *